United States Patent [19]

Betzl et al.

[11]  4,281,296
[45]  Jul. 28, 1981

[54] ELECTRICAL FILTER CIRCUIT UTILIZING CHARGE TRANSFER DEVICES FORMED AS LOOPED CIRCUITS

[75] Inventors: Hermann Betzl; Ernst Hebenstreit, both of Munich; Roland Schreiber, Ottobrunn-Riemerling, all of Fed. Rep. of Germany

[73] Assignee: Siemens Aktiengesellschaft, Berlin & Munich, Fed. Rep. of Germany

[21] Appl. No.: 60,194

[22] Filed: Jul. 24, 1979

[30] Foreign Application Priority Data

Jul. 26, 1978 [DE]  Fed. Rep. of Germany ....... 2832795

[51] Int. Cl.³ ..................... H03H 17/02; G11C 27/00
[52] U.S. Cl. ................................... 333/165; 333/173
[58] Field of Search ................................. 333/165, 173

[56] References Cited

FOREIGN PATENT DOCUMENTS 2453669 4/1976 Fed. Rep. of Germany ........... 333/165
2534319 2/1977 Fed. Rep. of Germany ........... 333/165
2608582 9/1977 Fed. Rep. of Germany ........... 333/165

OTHER PUBLICATIONS

MacLennan; Charge–Coupled Devices; Wireless World: Feb., 1975, pp. 61–65.

*Primary Examiner*—Eli Lieberman
*Attorney, Agent, or Firm*—Hill, Van Santen, Steadman, Chiara & Simpson

[57] ABSTRACT

An electrical filter circuit comprising charge transfer devices formed as lines consisting of individual CTD elements formed as four-terminal resonators formed as closed looped circuits and which determine the frequency-dependent transmission behavior of the filter circuit and wherein the four-terminal resonators are interconnected by way of a coupling circuit. In the invention, the filter circuit functions as a separating and shunt circuit and can be formed as an integrated circuit with two end resonators designed as self-contained closed looped circuits.

4 Claims, 1 Drawing Figure

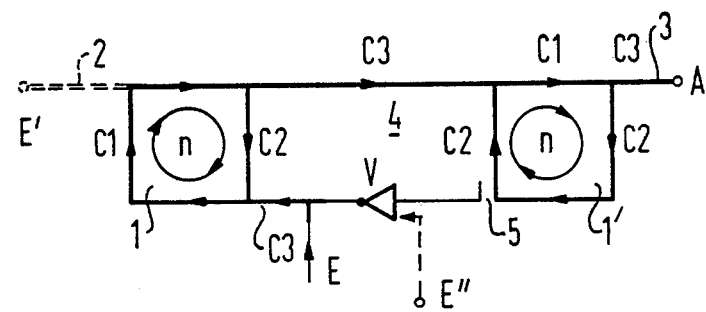

ELECTRICAL FILTER CIRCUIT UTILIZING CHARGE TRANSFER DEVICES FORMED AS LOOPED CIRCUITS

BACKGROUND OF THE INVENTION

1. Field of the Invention

This invention relates in general to filter circuits and in particular to a novel charge transfer device consisting of individual CTD elements formed into four-terminal quadripole resonators which are designed as self-contained closed looped circuits which determine the the frequency-dependent transmission behaviour of the filter circuit and wherein successive four-terminal resonators are interconnected by way of switching coupling circuits.

2. Description of the Prior Art

Filter circuits utilizing charge transfer devices are known as, for example, as described in German LP No. 2,453,669. Specific embodiments of such circuits are also described in German AS No. 2,534,319 and German AS No. 2,608,582. Also, see the article from Wireless World, February 1975, pages 61 through 65 entitled "Charge-Coupled Devices-Signal Processing" by D. J. MacLennan of the University of Edinburgh. In these publications, it is described that bucket brigade devices and charge coupled devices are designated as CTD lines. CCD circuits are installations which operate according to the principle of coupled charges. For these two types of circuits, BBD and CCD, the designation of "CTD-installation" (charge transfer device) has been adopted in the electronic technical language and such devices also have the characteristic that when used as a transmission device they are unidirectional. CTD devices consist of a greater integral number, for example, n individual CTD elements which can be constructed in the form of fully integratable arrangements. It is known that such CTD arrangements must be operated by way of clock pulse signals with a particular clock pulse frequency $f_T$ which clock pulse signals are supplied to the individual charge transfer capacitors of the BBD arrangements or to the transfer capacitances of the CCD lines. In practice, generally multiphase CTD arrangements are preferred over a single phase devices and the clock pulse signals are phase-displaced relative to each other so that adjacent transfer capacitances are operated with phase displaced clock pulses. Consequently, if a so-called p-phase clock pulse system (p-2, 3, 4 . . . ) is used then one CTD element consists of p adjacent transfer capacitances. For additional discussion of such devices refer to the book entitled "Charged Transfer Devices" Academic Press, Inc., New York, San Francisco, London, 1975.

Filter circuits constructed as described in German LP No. 2,453,669 or German AS No. 2,534,319 or according to German AS No. 2,608,582 utilize as the resonant structures self-contained or closed looped circuits which are designated in this application as four-terminal resonators. In German AS No. 2,534,319, input and output coupling circuits are additionally illustrated which are designed in the form of lattice filter section circuits wherein the properties of the CTD arrangements are considered when constructing the circuit. In the input and output coupling circuits illustrated in German AS No. 2,608,582 the filter is formed with $\pi$ sections.

The ratio of the transfer capacitance of the CTD devices utilized in the supply lines relative to the transfer capacitance of the CTD arrangements in the closed looped circuits utilized in the four-terminal resonator assists in determining the filter characteristics of the device.

Although the known filter circuits require only a comparatively small space since they are formed in integrated techniques, it is desirable to form such circuits with the smallest possible number of CTD elements.

SUMMARY OF THE INVENTION

The present invention discloses filter circuits formed in CTD technology in integrated form which utilizes the smallest possible number of charge transfer device elements.

In the present invention, this objective is accomplished by utilizing end resonators formed as self-contained closed looped circuits.

Other objects, features and advantages of the invention will be readily apparent from the following description of certain preferred embodiments thereof taken in conjunction with the accompanying drawings, although variations and modifications may be effected without departing from the spirit and scope of the novel concepts of the disclosure, and in which:

BRIEF DESCRIPTION OF THE DRAWING

The FIGURE illustrates a schematic illustration of the invention.

DESCRIPTION OF THE PREFERRED EMBODIMENTS

The invention utilizes the filter circuits described in German LP No. 2,453,669 and German AS No. 2,534,319 and 2,608,582 which describe filter circuits which can be used as separating or shunt circuits. This means that in the case of such known circuits there are two inputs and two outputs available. If the signal frequency $f_s$ corresponds to the resonant frequency $f_R$ of the self-contained closed looped circuit, in other words, if the signal frequency $f_s$ corresponds to the resonant frequency of the four-terminal resonators, the signal energy fed in at the first input will also be emitted at the first output. However, the further that the signal frequency $f_s$ is removed in frequency from the resonant frequency $f_R$ of the four-terminal resonators the greater amount of the component of the electrical energy fed in at the first input will be conveyed to the second output. Also, if the signal energy $f_s$ and the resonant frequency $f_R$ of the four-terminal resonators correspond as close as possible the signal energy fed in at the second input will then be almost completely emitted at the second output. As the deviation from the latter condition occurs, an increasingly greater component of the signal energy will be emitted at the first output.

In the drawing, separation or shunt characteristics of the prior art known circuits is not required and only a filter input and a filter output are available. However, when used as a filter circuit the illustrated circuit is completely functionally operative and it can be constructed with a small number as possible of charge transfer device elements. Also, in the illustrated circuit, amplifiers in the input circuit or in the output circuit, respectively, can be dispensed with because the connecting branches are not required and such amplifiers can be eliminated.

In the illustrated circuit structure, the broad lines represent CTD lines which have unidirectional transmission behaviour which is indicated by the arrows drawn in the individual line sections. The thinly drawn lines in the FIGURE illustrate galvanic line connections which have unidirectional transmission characteristics determined by the signal flow directions of the amplifiers connected into such lines.

In the drawing, a two circuit filter circuit is shown as an example so that the two end resonators 1 and 1' are the only filter resonators. These two resonators are interconnected by way of a coupling circuit 4. The two simplified four-terminal resonators 1 and 1' consist of CTD lines of which three line sections of the self-contained closed looped circuit have the transfer capacitances C1 or C2, respectively. The line sections adjacent the coupling circuit 4 have the transfer capacitances C2. By means of the self-contained or closed arrows illustrated in the drawing, the resonators 1 and 1' are indicated and the n indicates that such resonators have n CTD elements and the following relationship exists relative to their resonant frequency $f_R$ $$f_R = k \cdot f_T/n (k=1,2 \ldots n)$$

The coupling circuit 4 consists of a CTD line section having the transfer capacitance C3 which connects the upper longitudinal lines with the four-terminal resonators 1 and 1'. The end resonators 1 and 1' are completely designed as self-contained closed looped CTD circuits. A CTD line segment 3 follows the output resonator 1' which connects to the output terminal A of the filter circuit.

For forming the input circuits there are different possibilities which are shown in the FIGURE as E, E' or E''. The line of the coupling circuit 4 connecting the lower line sections of the four-terminal resonators 1 and 1' can contain a line section with the transfer capacitance C3 whose transmission direction is from the resonator 1' to the resonator 1. For this case, the possibility of dividing this line section at its input and to deliver the input at the input E to one of the split-off partial lines exists.

An additional possibility consists in feeding in the input signal at the input E'. In the sample embodiment, the input E' is connected to the upper longitudinal line of the resonator 1 by way of the CTD line 2. In both of these examples, the amplifier can be of simple amplfier with only a single input.

Also to connect the input signal as is represented in the simple embodiment shown in broken lines for the input E'' the signal can be supplied to a summation amplifier V having two inputs and one output and connected as shown. In the particular example the summation amplifier V is an inverting amplifier, in other words, its amplification factor has a negative polarity sign so that the output signals are thus always in opposite phase to the input signals. The amplifier V is connected in the return branch of the coupling circuit 4 so that its signal flow direction is toward the resonator 1 from the resonator 1'. The CTD elements can be additionally economically eliminated and the inexpensive manufacturing techniques for forming the capacitance values for the transfer capacitances of the output resonator can be accomplished due to the fact that the entire return line of the coupling circuit is designed as a galvanic line in the signal component to be conducted in a return direction is also coupled from the resonator 1' by way of a powerless output coupling. This powerless output coupling is represented in the FIGURE as a separate switching signal 5. Such powerless output couplings are known in the art. For example, for detail description of such devices refer to the book entitled "Charged Transfer Devices" Academic Press, Inc., New York, San Francisco, London 1975 and particularly to pages 53 through 57 where such output couplings for CTD circuits are described. The transfer capacitors for BBD circuits can be sampled in an analogous manner if the following amplifier has an input resistance which approaches infinity. In the book entitled "Charged Transfer Devices" referenced above and particularly pages 47 through 61, circuits are described which are suitable for converting analog signals into signals which are suitable for further processing in CTD technology and for reconstructing signals processed in CTD technology into analog signals.

Although the invention has been described with respect to preferred embodiments, it is not to be so limited as changes and modifications can be made which are within the full intended scope of the invention as defined by the appended claims.

We claim as our invention:

1. A filter circuit comprising a first end four-terminal resonator (1) comprising a charge transfer device having n individual elements with its output connected to its input to form a self-contained closed loop, a second end four terminal resonator (1') comprising a charge transfer device having n individual elements with its output connected to its input to form a self-contained closed loop, a coupling circuit (4) formed of a pair of charge transfer device line sections having the transfer capacitance of C3 interconnecting and forming first and second longitudinal lines between said first and second end resonators, an output terminal (A), an output charge transfer device line (3) connected between said output terminal (A) and said second end four terminal resonator (1'), and an input terminal (E) connected to said first end four terminal resonator (1) through said second longitudinal line of said coupling circuit (4) and supplying an input (E) thereto.

2. A filter circuit comprising a first end four terminal resonator (1) comprising a charge transfer device having n individual elements with its output connected to its input to form a self-contained closed loop, a second end four terminal resonator (1') comprising a charge transfer device having n individual elements with its output connected to its input to form a self-contained closed loop, a coupling circuit (4) formed of a pair of charge transfer device line sections having the transfer capacitance of C3 interconnecting and forming first and second longitudinal lines between said first and second end resonators, an output terminal (A), an output charge transfer device line (3) connected between said output terminal (B) and said second end four terminal resonator (1'), and an output charge transfer device (2) connected to said first end four terminal resonator and supplying an input E' thereto.

3. A filter circuit comprising a first end four terminal resonator (1) comprising a charge transfer device having n individual elements with its output connected to its input to form a self-contained closed loop, a second end four terminal resonator (1') comprising a charge transfer device having n individual elements with its output connected to its input to form a self-contained closed loop, a coupling circuit (4) formed of a pair of charge transfer device line sections having the transfer capacitance of C3 interconnecting and forming first and second longitudinal lines between said first and second end resonators, an output terminal (A), an output charge transfer device line (3) connected between said output terminal (A) and said second end four terminal resonator (1'), and a summation amplifier (V) connected to said second longitudinal line and receiving an input (E'').

4. A filter circuit comprising a first end four terminal resonator (1) comprising a charge transfer device having n individual elements with its output connected to its input to form a self-contained closed loop, a second end four terminal resonator (1') comprising a charge transfer device having n individual elements with its output connected to its input to form a self-contained closed loop, a coupling circuit (4) formed of a pair of charge transfer device line sections having the transfer capacitance of C3 interconnecting and forming first and second longitudinal lines between said first and second end resonators, an output terminal (A), an output charge transfer device line (3) connected between said output terminal (A), and said second end four terminal resonator (1'), a summation amplifier (V) connected to said second longitudinal line and receiving an input (E''), and said second longitudinal line powerless coupled (5) to said second end four terminal resonator (1').

* * * * *